US012771146B2

(12) United States Patent
Murai et al.

(10) Patent No.: US 12,771,146 B2
(45) Date of Patent: Oct. 20, 2026

(54) CHARGING/DISCHARGING CONTROL METHOD AND CHARGING/DISCHARGING CONTROL DEVICE

(71) Applicants: NISSAN MOTOR CO., LTD., Yokohama (JP); RENAULT s.a.s., Boulogne-Billancourt (FR)

(72) Inventors: Kensuke Murai, Kanagawa (JP); Kenta Suzuki, Kanagawa (JP)

(73) Assignees: NISSAN MOTOR CO., LTD., Yokohama (JP); RENAULT s.a.s., Boulogne-Billancourt (FR)

(*) Notice: Subject to any disclaimer, the term of this patent is extended or adjusted under 35 U.S.C. 154(b) by 0 days.

(21) Appl. No.: 18/708,123

(22) PCT Filed: Nov. 8, 2021

(86) PCT No.: PCT/IB2021/000763
§ 371 (c)(1),
(2) Date: May 7, 2024

(87) PCT Pub. No.: WO2023/079327
PCT Pub. Date: May 11, 2023

(65) Prior Publication Data

US 2024/0416791 A1 Dec. 19, 2024

(51) Int. Cl.
*H02J 7/47* (2026.01)
*B60L 53/62* (2019.01)
(Continued)

(52) U.S. Cl.
CPC ................ *H02J 7/47* (2026.01); *B60L 53/62* (2019.02); *B60L 53/66* (2019.02);
(Continued)

(58) Field of Classification Search
CPC .......... G01R 19/16538; G01R 19/2513; G01R 31/40; H02J 7/00032; H02J 7/00712; G05F 1/66; B60L 53/62; B60L 53/06
(Continued)

(56) References Cited

U.S. PATENT DOCUMENTS 6,546,343 B1 * 4/2003 Batra .................. G06F 13/4072 326/62
7,446,433 B2 * 11/2008 Masciarelli ............. H02J 9/062 307/66
(Continued)

FOREIGN PATENT DOCUMENTS

JP 2011-223657 A 11/2011
JP 2015-065792 A 4/2015
(Continued)

*Primary Examiner* — John T Trischler
(74) *Attorney, Agent, or Firm* — Foley & Lardner LLP

(57) ABSTRACT

A charging/discharging control method and a charging/discharging control device, when controlling a power module connected to any of a plurality of power systems, receive a signal broadcast for each of the power systems via a receiver included in the power module, calculate a degree of relationship between the acquired signal and an input voltage inputted to the power module for each of the power systems, and control the power module based on the signal relating to the power system having the degree of relationship greater than or equal to a prescribed threshold.

14 Claims, 4 Drawing Sheets

(51) Int. Cl.

| | |
|---|---|
| ***B60L 53/66*** | (2019.01) |
| ***G01R 19/165*** | (2006.01) |
| ***G01R 19/25*** | (2006.01) |
| ***G01R 31/40*** | (2020.01) |
| ***G05F 1/66*** | (2006.01) |
| ***H02J 7/40*** | (2026.01) |
| ***H02J 7/42*** | (2026.01) |
| ***H02J 7/44*** | (2026.01) |
| ***H02J 7/90*** | (2026.01) |
| ***H02J 50/80*** | (2016.01) |
| *B60L 53/30* | (2019.01) |
| *B60L 53/65* | (2019.01) |
| *B60L 53/67* | (2019.01) |
| *B60L 53/68* | (2019.01) |
| *G01R 21/06* | (2006.01) |
| *H01M 10/44* | (2006.01) |
| *H02J 7/80* | (2026.01) |

(52) U.S. Cl.
CPC ... *G01R 19/16538* (2013.01); *G01R 19/2513* (2013.01); *G01R 31/40* (2013.01); *G05F 1/66* (2013.01); *H02J 7/40* (2026.01); *H02J 7/42* (2026.01); *H02J 7/44* (2026.01); *H02J 7/933* (2026.01); *H02J 50/80* (2016.02); *B60L 53/30* (2019.02); *B60L 53/65* (2019.02); *B60L 53/67* (2019.02); *B60L 53/68* (2019.02); *G01R 21/06* (2013.01); *H01M 10/441* (2013.01); *H02J 7/80* (2026.01)

(58) Field of Classification Search
USPC ................ 320/109; 324/764.01; 702/182, 62
See application file for complete search history.

(56) References Cited

U.S. PATENT DOCUMENTS 7,615,890 B2 * 11/2009 Masciarelli ............. H02J 9/062 307/66
7,948,208 B2 * 5/2011 Partovi ................. H02J 7/0013 320/108
8,030,888 B2 * 10/2011 Pandya ................... H02J 50/12 320/108
8,148,846 B2 * 4/2012 Masciarelli ............. H02J 9/062 307/26
8,604,640 B2 * 12/2013 Masciarelli ............. H02J 9/062 307/66
8,629,652 B2 * 1/2014 Partovi ................... H02J 50/80 320/108
8,692,512 B2 * 4/2014 Tanikawa ................ B60L 58/20 320/109
8,994,328 B2 * 3/2015 Lee ......................... B60L 53/31 320/152
9,030,051 B2 * 5/2015 Muratov ................. H02J 50/12 307/104
9,088,173 B2 7/2015 Ogawa et al.
9,153,989 B2 * 10/2015 Matsunaga ............. B60L 1/003
9,356,659 B2 * 5/2016 Partovi ................... H02J 50/12
9,446,674 B2 * 9/2016 Halker .................. B60L 53/122
9,461,501 B2 * 10/2016 Partovi ................... H02J 50/80
9,484,985 B2 * 11/2016 Kim ....................... H04B 5/266
9,583,803 B2 * 2/2017 Miller ................. H01M 50/342
9,649,947 B2 * 5/2017 Ichikawa ................ B60L 53/65
9,666,915 B2 * 5/2017 Miller ..................... H02J 50/80
9,834,104 B2 * 12/2017 Tsukamoto ............. H02J 50/40
9,837,646 B2 * 12/2017 Miller ................... H01M 50/24
9,859,594 B2 * 1/2018 Miller ..................... H02J 50/12
9,905,358 B2 * 2/2018 Wakabayashi .......... B60L 53/36
9,925,886 B2 * 3/2018 Halker ................... G08G 1/123
9,941,755 B2 * 4/2018 Hwang .................... H04B 5/79
9,991,753 B2 * 6/2018 Miller ................... H02J 50/402
10,023,058 B2 * 7/2018 Ichikawa ................ B60L 53/36
10,056,790 B2 * 8/2018 Miller ................... H01M 50/24
10,074,837 B2 * 9/2018 Miller ................... H02J 7/0044
10,189,364 B2 * 1/2019 Ichikawa ................ B60L 53/68
10,286,796 B2 * 5/2019 Lee ....................... B60L 53/126
10,300,805 B2 * 5/2019 Halker .................... B60L 53/35
10,399,451 B2 * 9/2019 Zaki ........................ B60L 53/16
10,471,836 B2 * 11/2019 Yabuuchi .................. B60L 3/04
10,479,209 B2 * 11/2019 Yabuuchi .................. H02J 7/00
10,541,543 B2 * 1/2020 Eaves ..................... B60L 53/68
10,601,251 B2 * 3/2020 Keith .................... H02J 7/0042
10,622,827 B2 * 4/2020 Ichikawa ................ B60L 53/38
10,661,660 B2 * 5/2020 Lee ....................... H02J 7/0013
10,688,875 B2 6/2020 Iwai et al.
10,793,017 B2 * 10/2020 Lee ........................... B60L 3/04
10,836,273 B2 * 11/2020 Zhu ......................... B60L 53/20
10,871,795 B2 12/2020 Ohori et al.
10,899,234 B2 * 1/2021 Ichikawa ................ B60L 53/68
10,910,875 B2 * 2/2021 Teng ......................... H02J 7/14
10,953,757 B2 * 3/2021 Shin ...................... B60L 53/122
11,018,533 B2 * 5/2021 Kanakasabai ......... B60L 53/122
11,075,542 B2 * 7/2021 Wan ........................ H02J 50/10
11,101,705 B2 * 8/2021 Zeine ...................... H02J 50/20
11,121,580 B2 * 9/2021 Partovi ................. H02J 50/402
11,173,794 B2 * 11/2021 Tsukamoto ............. B60L 53/38
11,233,423 B2 * 1/2022 Wan .................... H02J 7/00714
11,342,777 B2 * 5/2022 Partovi ................... H01F 38/14
11,349,320 B2 * 5/2022 Kim ...................... H02J 50/402
11,355,963 B2 * 6/2022 Wan ........................ H02J 50/10
11,368,050 B2 * 6/2022 Wan .................... H02J 7/00714
11,374,431 B2 * 6/2022 Keith .................. H02J 7/00714
11,376,986 B2 * 7/2022 Ezer ....................... G06Q 50/06
11,390,186 B2 * 7/2022 Murai ........................ H02J 3/14
11,398,747 B2 * 7/2022 Partovi ................... H02J 50/12
11,437,848 B2 * 9/2022 Wan .................. H02J 7/007182
11,451,139 B2 * 9/2022 Forouzesh .............. H02M 7/06
11,476,717 B2 * 10/2022 Azam ..................... H02J 50/80
11,539,219 B2 * 12/2022 Wan ...................... H02J 7/0068
11,646,606 B2 * 5/2023 Palacharla .............. H02J 50/10 307/108
11,770,029 B2 * 9/2023 Park ..................... H04B 7/0608 307/104
11,843,271 B2 * 12/2023 Murai ................... H02J 7/0013
11,880,786 B2 * 1/2024 Tokuoka ................ G06Q 50/40
11,984,726 B2 * 5/2024 Suzuki .................. H02J 7/0047
12,046,414 B2 * 7/2024 Partovi ................. H02J 50/402
12,057,726 B2 * 8/2024 Murai ................... H02J 7/0048
12,083,899 B2 * 9/2024 Suzuki .................... B60L 58/13
12,100,987 B2 * 9/2024 Hao ......................... H02J 50/40
12,142,145 B2 * 11/2024 Suzuki ............ G08G 1/096816
2005/0162019 A1 * 7/2005 Masciarelli ............. H02J 9/062 307/66
2007/0279002 A1 * 12/2007 Partovi .............. G06K 19/0704 320/115
2009/0045773 A1 * 2/2009 Pandya ................... H02J 50/90 320/108
2011/0213983 A1 * 9/2011 Staugaitis ............... B60L 58/40 713/176
2011/0254505 A1 * 10/2011 Evander ................ G07F 15/003 320/109
2011/0291615 A1 * 12/2011 Pandya ................... B60L 53/52 320/108
2012/0068663 A1 * 3/2012 Tanikawa ................ B60L 53/14 320/109
2012/0126745 A1 * 5/2012 Partovi .............. G06K 19/0704 320/108
2012/0200258 A1 * 8/2012 Lee ......................... B60L 53/66 320/109
2012/0309305 A1 * 12/2012 Kim ......................... H04B 5/72 455/41.1
2013/0057073 A1 * 3/2013 Masciarelli ............. H02J 9/062 307/64
2013/0127409 A1 * 5/2013 Ichikawa .............. B60L 53/122 320/108
2013/0147279 A1 * 6/2013 Muratov ............. H02J 7/00036 307/104
2013/0200718 A1 8/2013 Ogawa et al.
2013/0249479 A1 * 9/2013 Partovi ................... H02J 50/60 320/108

(56) References Cited

U.S. PATENT DOCUMENTS

| | | | | |
|---|---|---|---|---|
| 2013/0271069 | A1* | 10/2013 | Partovi | H02J 50/50 320/108 |
| 2013/0311017 | A1* | 11/2013 | Matsunaga | H01M 10/42 701/22 |
| 2014/0103873 | A1* | 4/2014 | Partovi | H02J 50/80 320/108 |
| 2015/0015419 | A1* | 1/2015 | Halker | B60L 53/124 320/108 |
| 2015/0115731 | A1* | 4/2015 | Wakabayashi | H02J 50/70 307/104 |
| 2015/0123610 | A1* | 5/2015 | Zaki | B60L 58/10 320/109 |
| 2015/0217648 | A1* | 8/2015 | Ichikawa | B60L 53/36 320/108 |
| 2015/0270718 | A1* | 9/2015 | Hwang | H04B 5/24 307/104 |
| 2015/0362333 | A1* | 12/2015 | Miller | H02J 7/0044 340/870.02 |
| 2015/0364799 | A1* | 12/2015 | Miller | H02J 50/80 320/108 |
| 2015/0364945 | A1* | 12/2015 | Miller | H01M 10/482 320/108 |
| 2015/0365135 | A1* | 12/2015 | Miller | H02J 50/80 307/104 |
| 2015/0365136 | A1* | 12/2015 | Miller | H02J 50/80 307/104 |
| 2015/0365137 | A1* | 12/2015 | Miller | H01M 50/342 307/104 |
| 2015/0365138 | A1* | 12/2015 | Miller | H04B 5/79 307/104 |
| 2015/0365737 | A1* | 12/2015 | Miller | H02J 50/10 340/870.02 |
| 2016/0046194 | A1* | 2/2016 | Tsukamoto | B60L 53/124 307/104 |
| 2016/0236576 | A1 | 8/2016 | Hika | |
| 2016/0297314 | A1 | 10/2016 | Iwai et al. | |
| 2016/0318414 | A1* | 11/2016 | Ichikawa | B60L 53/305 |
| 2017/0025896 | A1* | 1/2017 | Partovi | G06K 19/0704 |
| 2017/0101024 | A1* | 4/2017 | Halker | B60L 53/665 |
| 2017/0125758 | A1* | 5/2017 | Miller | H04B 5/79 |
| 2017/0210232 | A1* | 7/2017 | Ichikawa | B60L 53/36 |
| 2017/0237296 | A1* | 8/2017 | Keith | H02J 50/40 307/104 |
| 2017/0358942 | A1* | 12/2017 | Pugh | A61B 5/021 |
| 2018/0123360 | A1* | 5/2018 | Eaves | H02J 7/00034 |
| 2018/0130984 | A1* | 5/2018 | Miller | A61B 5/0015 |
| 2018/0141443 | A1* | 5/2018 | Lee | H02J 7/0042 |
| 2018/0141444 | A1* | 5/2018 | Lee | B60L 58/10 |
| 2018/0215278 | A1* | 8/2018 | Yabuuchi | H01M 10/48 |
| 2018/0236888 | A1* | 8/2018 | Yabuuchi | H01M 10/44 |
| 2018/0248413 | A1* | 8/2018 | Miller | H01M 50/24 |
| 2018/0272885 | A1* | 9/2018 | Halker | B60L 53/126 |
| 2018/0304756 | A1* | 10/2018 | Ichikawa | B60L 53/126 |
| 2019/0081497 | A1* | 3/2019 | Pugh | A61B 5/0816 |
| 2019/0097448 | A1* | 3/2019 | Partovi | B60L 53/12 |
| 2019/0118664 | A1* | 4/2019 | Ichikawa | B60L 53/305 |
| 2019/0173309 | A1* | 6/2019 | Jung | H02J 50/90 |
| 2019/0176654 | A1* | 6/2019 | Lee | G01R 31/52 |
| 2019/0202298 | A1* | 7/2019 | Shin | B60L 9/00 |
| 2019/0245383 | A9* | 8/2019 | Keith | H02J 50/40 |
| 2019/0305587 | A1* | 10/2019 | Teng | H02J 7/00 |
| 2019/0356156 | A1* | 11/2019 | Wan | H02J 50/80 |
| 2019/0372387 | A1* | 12/2019 | Wan | H02J 50/12 |
| 2019/0379245 | A1* | 12/2019 | Wan | H02J 7/007182 |
| 2019/0389315 | A1* | 12/2019 | Zhu | B60L 53/64 |
| 2020/0014252 | A1* | 1/2020 | Wan | H04B 5/79 |
| 2020/0021130 | A1* | 1/2020 | Wan | H02J 50/80 |
| 2020/0036215 | A1* | 1/2020 | Wan | H02J 7/00714 |
| 2020/0086756 | A1* | 3/2020 | Beaude | B60L 53/66 |
| 2020/0099256 | A1* | 3/2020 | Kanakasabai | H02J 50/40 |
| 2020/0169121 | A1* | 5/2020 | Keith | H02J 50/40 |
| 2020/0183436 | A1 | 6/2020 | Ohori et al. | |
| 2020/0220391 | A1* | 7/2020 | Zeine | H02J 50/20 |
| 2020/0227932 | A1* | 7/2020 | Kim | H02J 50/80 |
| 2020/0235656 | A1* | 7/2020 | Forouzesh | H02M 1/4258 |
| 2020/0287424 | A1* | 9/2020 | Azam | H02J 50/40 |
| 2020/0403458 | A1* | 12/2020 | Vedady Moghadam Nanehkaran | H02J 7/345 |
| 2020/0406774 | A1* | 12/2020 | Tsukamoto | B60L 53/39 |
| 2021/0309119 | A1* | 10/2021 | Ezer | B60L 53/62 |
| 2021/0326778 | A1* | 10/2021 | Tokuoka | G06Q 30/0206 |
| 2021/0351627 | A1* | 11/2021 | Park | H04B 5/79 |
| 2022/0060043 | A1* | 2/2022 | Hao | H02J 50/402 |
| 2022/0069632 | A1* | 3/2022 | Partovi | B60L 53/12 |
| 2022/0153163 | A1* | 5/2022 | Murai | H02J 3/14 |
| 2022/0158470 | A1* | 5/2022 | Murai | H02J 7/00714 |
| 2022/0161687 | A1* | 5/2022 | Al-Sagheer | H02J 3/32 |
| 2022/0176823 | A1* | 6/2022 | Suzuki | H02J 7/00712 |
| 2022/0239158 | A1* | 7/2022 | Palacharla | H02J 50/70 |
| 2022/0329106 | A1* | 10/2022 | Partovi | H02J 50/502 |
| 2023/0032915 | A1* | 2/2023 | Suzuki | G08G 1/096775 |
| 2023/0187128 | A1* | 6/2023 | Partovi | H02J 7/0013 320/108 |
| 2023/0406137 | A1* | 12/2023 | Yamamoto | B60L 53/14 |
| 2024/0083275 | A1* | 3/2024 | Li | B60L 53/66 |
| 2024/0088677 | A1* | 3/2024 | Murai | B60L 53/67 |
| 2024/0097467 | A1* | 3/2024 | Murai | B60L 58/12 |
| 2024/0116378 | A1* | 4/2024 | Ikezoe | H01M 10/441 |
| 2024/0120742 | A1* | 4/2024 | Suzuki | H02J 7/00712 |
| 2024/0140242 | A1* | 5/2024 | Kromrey | B60L 53/305 |
| 2024/0217379 | A1* | 7/2024 | Lin | B60L 53/62 |
| 2024/0317080 | A1* | 9/2024 | Nakagawa | H02J 50/10 |
| 2024/0317099 | A1* | 9/2024 | Wang | H02J 7/007192 |
| 2024/0359590 | A1* | 10/2024 | Oka | B60L 58/10 |
| 2024/0371569 | A1* | 11/2024 | Partovi | H01F 38/14 |

FOREIGN PATENT DOCUMENTS

| | | | |
|---|---|---|---|
| JP | 2015-100173 | A | 5/2015 |
| JP | 2020-124061 | A | 8/2020 |
| WO | WO-2017/150376 | A1 | 9/2017 |

* cited by examiner

CHARGING/DISCHARGING CONTROL METHOD AND CHARGING/DISCHARGING CONTROL DEVICE

TECHNICAL FIELD

The present invention relates to a charging/discharging control method and a charging/discharging control device.

BACKGROUND ART

An invention in which in a power system including a plurality of power conditioners (power modules) and a central management device which manages the plurality of power conditioners, a control unit included in each power conditioner calculates an individual target power of the power conditioner based on a signal transmitted from the central management device and controls an individual output power of the power conditioner such that the individual output power becomes equal to the individual target power has been known (Patent Literature 1).

CITATION LIST

Patent Literature

Patent Literature 1: International Publication No. WO2017/150376

SUMMARY OF INVENTION

Problems to be Solved by Invention

According to the invention described in Patent Literature 1, since a signal from the central management device is transmitted through wireless communications, in a case where different power systems are adjacent to each other, there is a possibility that the control unit included in the power conditioner receives signals from a plurality of central management devices. In this case, there is a problem that it is necessary for the user to designate a signal that has to be followed in a charging/discharging control of the power conditioner from among a plurality of signals, thus increasing works until the start of the charging/discharging control of the power conditioner.

The present invention has been made in view of the above-described problem. An object of the present invention is to provide a charging/discharging control method and a charging/discharging control device that are capable of specifying a signal that has to be followed in a charging/discharging control of a power module without designation from a user and starting the charging/discharging control of the power module even in a case where a receiver included in the power module receives signals from a plurality of power systems.

Solution to Solve Problems

A charging/discharging control method and a charging/discharging control device in accordance with an embodiment of the present invention, when controlling a power module connected to any of a plurality of power systems, receive a signal broadcast for each of the power systems via a receiver included in the power module. The method and the device then calculate a degree of relationship between the acquired signal and an input voltage inputted to the power module for each of the power systems, and control the power module based on the signal relating to the power system having the degree of relationship greater than or equal to a prescribed threshold.

Effects of Invention

The present invention makes it possible to specify a signal that has to be followed in a charging/discharging control of a power module without designation from a user and to start the charging/discharging control of the power module even in a case where a receiver included in the power module receives signals from a plurality of power systems.

DESCRIPTION OF EMBODIMENTS

Hereinafter, embodiments according to the present invention will be described with reference to the drawings. In the description of the drawings, the same parts are denoted by the same reference signs, and description of these will be omitted.

(Configuration of Power System)

Figure 1:
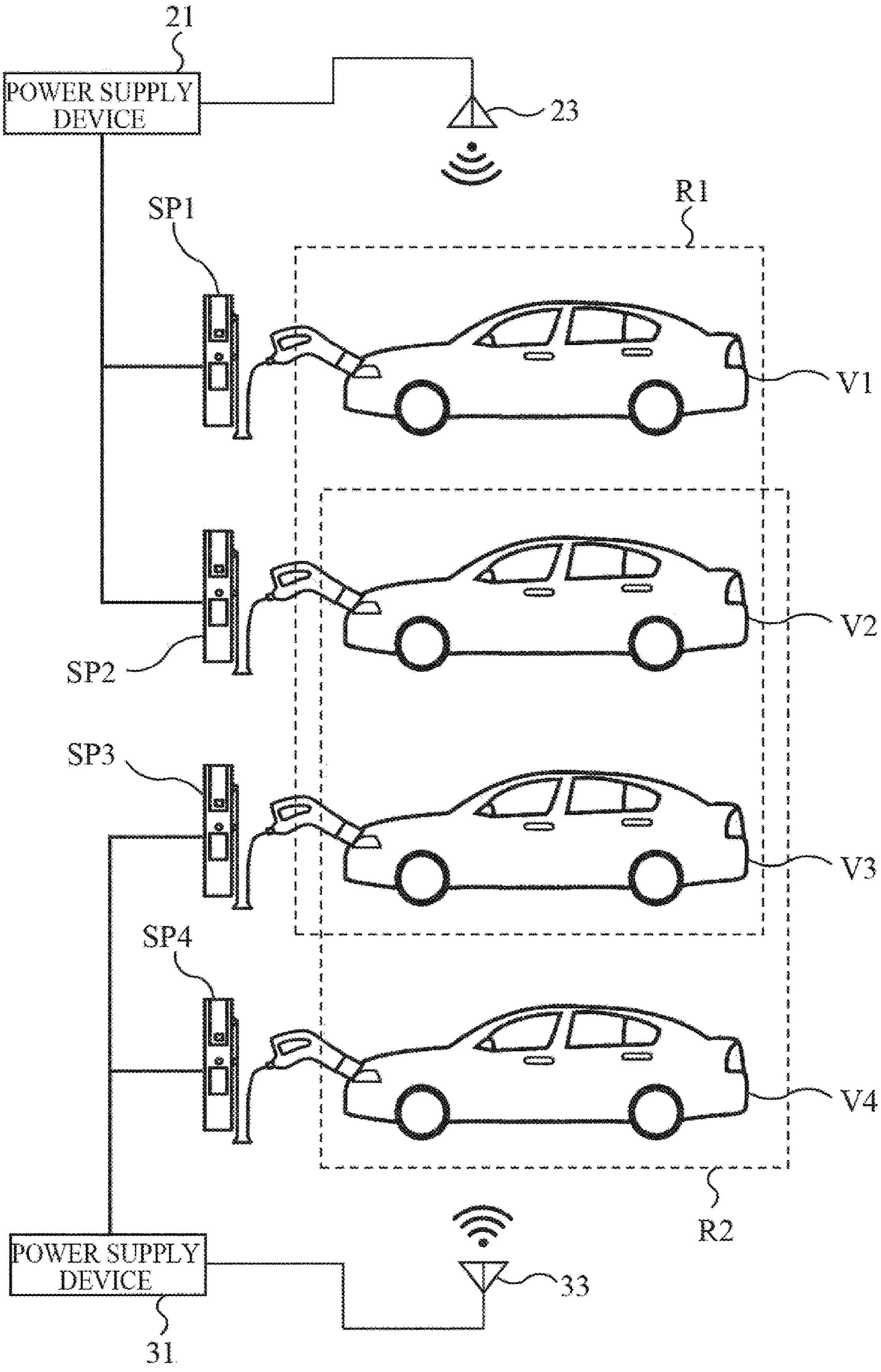
FIG. 1 is a schematic diagram showing a configuration of a power system according to one embodiment of the present invention.

An example of a configuration of a power system according to the present embodiment will be described with reference to FIG. 1. FIG. 1 shows vehicles V1, V2, V3, and V4. The vehicles V1, V2, V3, and V4 each include a power module 50 and a charging/discharging control device 10 as described later. For example, the power module 50 is an on-board rechargeable battery. The power module 50 and the charging/discharging control device 10 are not limited to those to be mounted on vehicles, but otherwise may be those mounted on mobile bodies (aircraft, drones, and the like).

In addition, FIG. 1 shows a power supply device 21 which supplies power to charging spots SP1 and SP2, and a transmitter 23 which conducts broadcasting to the vehicles V1, V2, and V3 located in an area R1 through wireless communications. The power modules 50 mounted on the vehicles V1 and V2 are supplied with power from the power supply device 21 via the charging spots SP1 and SP2, respectively. The power supply device 21, the transmitter 23, the charging spots SP1 and SP2, and the vehicles V1 and V2 constitute a first power system.

Moreover, FIG. 1 shows a power supply device 31 which supplies power to charging spots SP3 and SP4, and a transmitter 33 which conducts broadcasting to the vehicles V2, V3, and V4 located in an area R2 through wireless communications. The power modules 50 mounted on the vehicles V3 and V4 are supplied with power from the power supply device 31 via the charging spots SP3 and SP4, respectively. The power supply device 31, the transmitter 33, the charging spots SP3 and SP4, and the vehicles V3 and V4 constitute a second power system.

Not limited to the example shown in FIG. 1, the number of charging spots connected to the power supply device 21 or 31 may be one or may be two or more. In addition, the number of vehicles which are supplied with power from the power supply device 21 or 31 may be one or may be two or more. Besides, the number of power systems may be two or more.

It should be noted that in FIG. 1, the vehicles V2 and V3 located on both of the area R1 and the area R2 can receive a first signal from the transmitter 23 through broadcasting and can receive a second signal from the transmitter 33 through broadcasting. The first signal is a signal relating to the first power system and is a signal for adjusting supply power in the first power system. The second signal is a signal relating to the second power system and is a signal for adjusting supply power in the second power system.

At a time point when the vehicle V2 and the vehicle V3 are connected respectively to the charging spot SP2 and the charging spot SP3 to start charging, which signal of the first signal and the second signal the control of the power module 50 mounted on the vehicle V2 or V3 has to be based on is unclear. On the other hand, it can be seen that the power module 50 mounted on the vehicle V2 or V3 is connected to either one of the first power system and the second power system based on the fact that the vehicle V2 or V3 can receive both first signal and second signal.

If the user were to specify which signal the control of the power module 50 has to be based on, a problem would occur that works until the start of the charging/discharging control of the power module 50 increase, which is cumbersome to the user. In addition, if which signal the control of the power module 50 has to be based on were specified through communications between the charging spot SP2 and the vehicle V2 or communications between the charging spot SP3 and the vehicle V3, it would be necessary to provide a facility for communications between charging spots and vehicles, which causes a problem that the cost increases. As described later, the charging/discharging control device 10 which controls the power module 50 can solve these problems.

(Configuration of Charging/Discharging Control Device)

Figure 2:
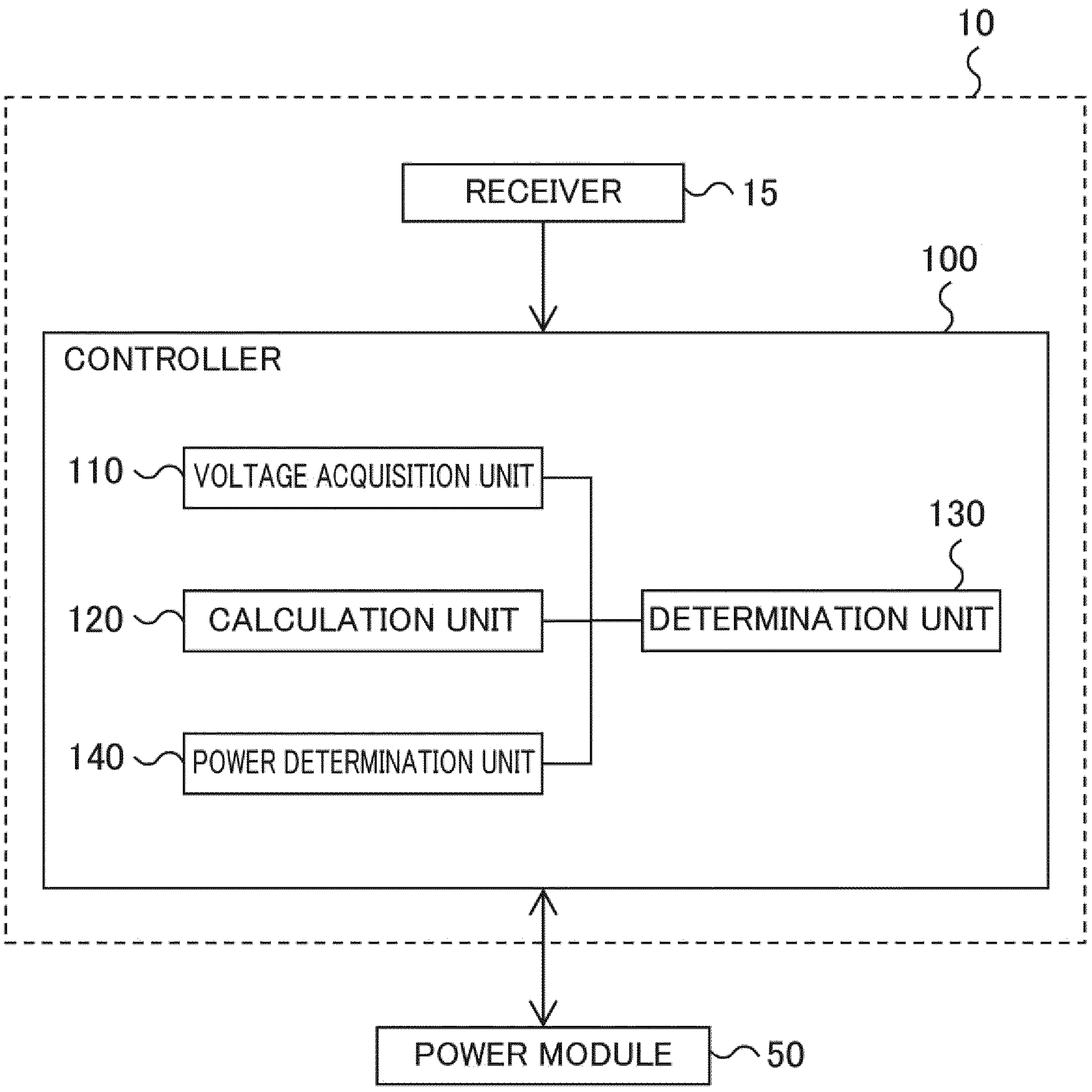
FIG. 2 is a block diagram showing a configuration of a charging/discharging control device included in the power system according to the one embodiment of the present invention.

FIG. 2 is a block diagram showing a configuration of the charging/discharging control device included in the power system according to the present embodiment. As shown in FIG. 2, the charging/discharging control device 10 includes a receiver 15 and a controller 100. In addition, the controller 100 is connected to the power module 50.

The receiver 15 receives a signal broadcast from the transmitter (the transmitter 23 or 33 in FIG. 1) included in the power system through wireless communications. For example, the receiver 15 may receive signals transmitted from the transmitter by means of a radio wave such as a low-frequency wave or an ultra-high frequency wave or may receive signals transmitted from the transmitter by means of an infrared ray. Besides, the receiver 15 may receive signals transmitted from the transmitter by utilizing a mobile communication function such as 4G/LTE or 5G.

The receiver 15 receives a signal broadcast for each power system. The receiver 15 may receive the signal at at least two or more time points for each power system. A larger number of time points at which signals are acquired by the receiver 15 for each power system allow the precision of calculation of a degree of relationship, which will be described later, to be improved. Note that the receiver 15 may receive the signal during a duration time greater than or equal to a prescribed time period for each power system.

The controller 100 is a general-purpose computer including a CPU (Central Processing Unit), a memory, a storage device, an input-output unit, and the like.

In the controller 100, a computer program (charging/discharging control program) for allowing the controller 100 to function as the charging/discharging control device 10 is installed. By executing the computer program, the controller 100 functions as a plurality of information processing circuits included in the charging/discharging control device 10.

Note that although an example of achieving the plurality of information processing circuits included in the charging/discharging control device 10 by means of software is shown here, it is of course also possible to configure the information processing circuits by preparing hardware dedicated to executing each information processing shown below. In addition, the plurality of information processing circuits may be configured by means of individual hardware.

The controller 100 includes a voltage acquisition unit 110, a calculation unit 120, a determination unit 130, and a power determination unit 140.

The voltage acquisition unit 110 acquires an input voltage of power inputted from the power system to the power module 50. Note that the voltage acquisition unit 110 may acquire an input voltage at at least two or more time points for each power system while the receiver 15 is receiving signals broadcast for each power system. In addition, the voltage acquisition unit 110 may acquire an input voltage during a duration time greater than or equal to a prescribed time period for each power system.

The calculation unit 120 calculates a degree of relationship between a signal (signal to be evaluated) received via the receiver 15 and an input voltage acquired by the voltage acquisition unit 110 for each power system. Note that the calculation unit 120 may use a signal having an intensity greater than or equal to a prescribed intensity as a signal to be evaluated and calculate the degree of relationship based on the signal to be evaluated.

More specifically, the calculation unit 120 calculates a predicted amount of change in the power of the power module 50 based on a signal. In addition, the calculation unit 120 calculates an amount of change in the input voltage. Then, the calculation unit 120 calculates the degree of relationship between the signal and the input voltage based on the calculated predicted amount of change in the power and the calculated amount of change in the input voltage.

For example, there is a relation that as the charged power in the entire power module connected to a power system increases, the input voltage of the power module decreases, while as the charged power in the entire power module connected to the power system decreases, the input voltage of the power module increases. That is, the predicted amount of change in the power of the power module 50, which is calculated based on a signal for adjusting the supply power in the power system, and the amount of change in the input voltage are in a negative correlation.

Hence, the calculation unit 120 calculates the degree of relationship such that the degree of relationship calculated in a case where the calculated predicted amount of change in the power and the calculated amount of change in the input voltage have opposite signs becomes larger than the degree of relationship calculated in a case where the calculated predicted amount of change in the power and the calculated amount of change in the input voltage have the same sign.

In addition, the calculation unit 120 may calculate a ratio of the calculated amount of change in the input voltage to the calculated predicted amount of change in the power and calculate, for a signal having smaller dispersion of the calculated ratio, a larger degree of relationship for the signal. Note that to improve the precision of the dispersion of the ratio to be calculated, the aforementioned voltage acquisition unit 110 may acquire input voltages at at least three or more time points for each power system. With a larger number of time points at which to acquire input voltages, the precision of the dispersion of the ratio to be calculated is improved.

Besides, in the case where there are a plurality of signals for which the calculated degrees of relationship are equal, the calculation unit 120 may recalculate the degree of relationship based on a plurality of signals acquired after the power of the power module 50 is changed by a prescribed amount. For explanation, a signal relating to a first power system is called a first signal, and a signal relating to a second power system different from the first power system is called a second signal. Here, in a case where a degree of relationship calculated based on the first signal and a degree of relationship calculated based on the second signal are equal, the calculation unit 120 may recalculate the degree of relationship based on the first signal and the second signal acquired after the power of the power module 50 is changed by a prescribed amount.

The reason why the power of the power module 50 is changed by a prescribed amount in the above description is for measuring a response of the power system to the change in the power of the power module 50. A variation can occur in a signal for adjusting the supply power in the power system to which the power module 50 the power of which has been changed is connected. Hence, it is expected that for a signal in which a variation has occurred among a plurality of signals acquired after the power of the power module 50 is changed, the degree of relationship after the recalculation becomes large. Hence, it becomes easy to specify a signal that has to be used in controlling the power module 50 by recalculating the degree of relationship.

The determination unit 130 determines whether or not the receiver 15 has received a plurality of signals. In addition, the determination unit 130 determines whether or not the degree of relationship has been calculated by the calculation unit 120 for all signals to be evaluated among the plurality of signals received by the receiver 15.

Moreover, the determination unit 130 selects a signal to be used in controlling the power module 50 based on degrees of relationship from among a plurality of signals broadcast for each power system. More specifically, the determination unit 130 selects a signal having the degree of relationship greater than or equal to a prescribed threshold. In addition, the determination unit 130 may select a signal having the highest degree of relationship from among a plurality of signals broadcast for each power system. The number of signals to be selected by the determination unit 130 may be one or more.

The power determination unit 140 controls the power module 50 based on a signal selected by the determination unit 130.

Note that in the case where there are a plurality of signals selected by the determination unit 130, the power determination unit 140 may determine the amount of change in the power of the power module 50 based on the plurality of signals thus selected.

For explanation, a signal relating to a first power system is called a first signal, and a signal relating to a second power system different from the first power system is called a second signal. In addition, an absolute value of a predicted amount of increase in the power of the power module based on the first signal is called a first amount of increase, and an absolute value of a predicted amount of increase in the power of the power module based on the second signal is called a second amount of increase. The power determination unit 140 may determine a smaller amount of the first amount of increase and the second amount of increase as the amount of increase in the power of the power module 50. In the case of increasing the power of the power module 50, the reason why to select a smaller amount of the amounts of increase in the power calculated based on a plurality of signal includes stabilizing an operation of the entire power system, for example.

In addition, an absolute value of a predicted amount of decrease in the power of the power module based on the first signal is called a first amount of decrease, and an absolute value of a predicted amount of decrease in the power of the power module based on the second signal is called a second amount of decrease. The power determination unit 140 may determine a larger amount of the first amount of decrease and the second amount of decrease as the amount of decrease in the power of the power module 50. In the case of decreasing the power of the power module 50, the reason why to select a larger amount of the amounts of decrease in the power calculated based on a plurality of signals includes stabilizing the operation of the entire power system, for example.

(Procedure of Processing of Charging/Discharging Control)

Figure 3:
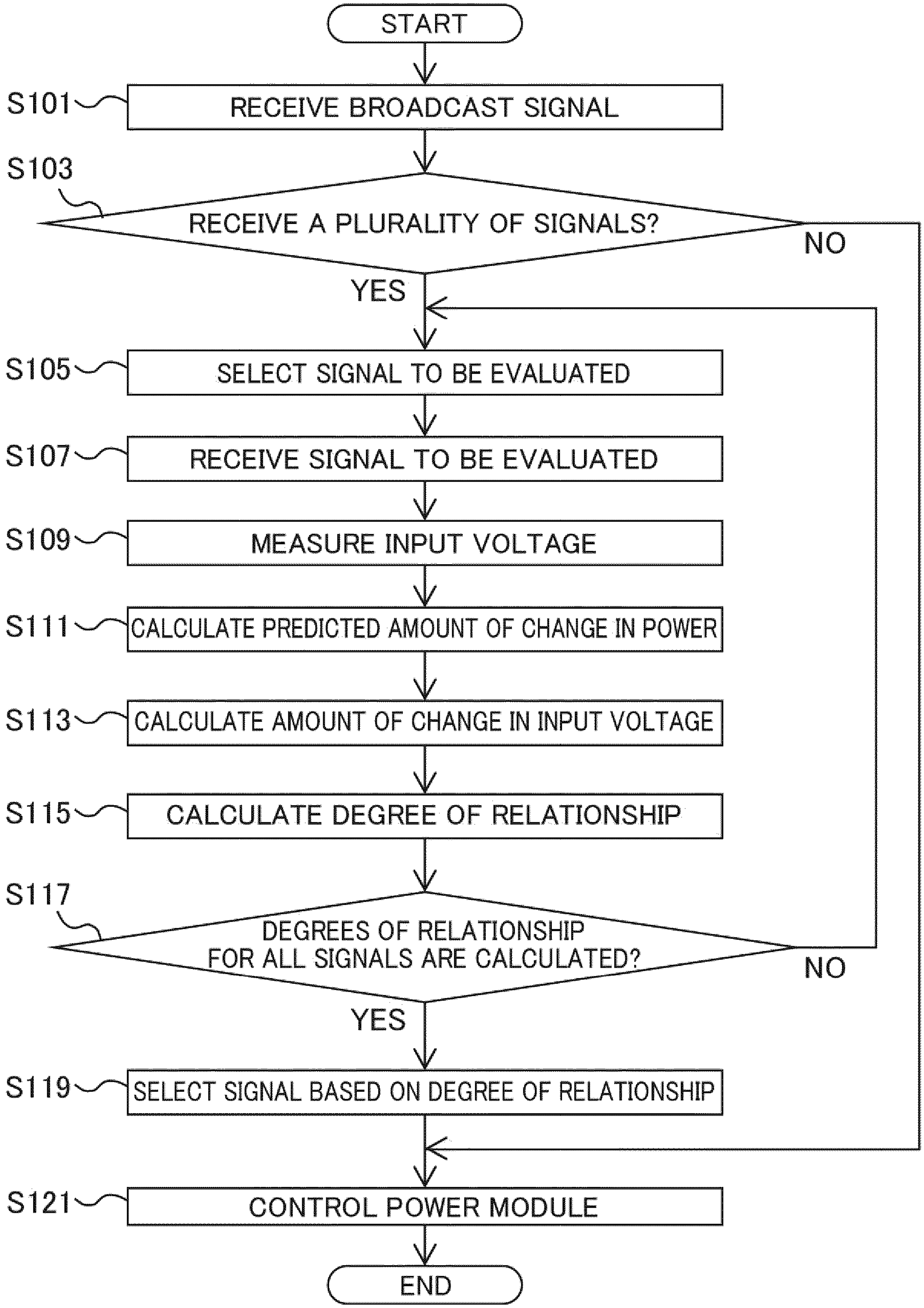
FIG. 3 is a flowchart showing processing of a charging/discharging control in the power system according to the one embodiment of the present invention.

Next, a procedure of processing of the charging/discharging control according to the present embodiment will be described with reference to a flowchart of FIG. 3. The processing shown in the flowchart of FIG. 3 may be repeatedly executed while charging is conducted by connecting the power module 50 to the power system. In addition, the processing shown in the flowchart of FIG. 3 may be repeatedly executed during a prescribed time period after the power module 50 is connected to the power system.

In step S101, the receiver 15 receives a signal broadcast from the transmitter included in the power system through wireless communications.

In step S103, the determination unit 130 determines whether or not the receiver 15 has received a plurality of signals.

If it is determined that the receiver 15 has not received a plurality of signals (NO in step S103), the processing proceeds to step S121.

If it is determined that the receiver 15 has received a plurality of signals (YES in step S103), the processing proceeds to step S105, and the calculation unit 120 selects a signal to be evaluated from among the plurality of signals thus received in order to evaluate the degree of relationship. For example, the controller 100 may set the receiver 15 in order to receive a signal to be evaluated.

In step S107, the receiver 15 receives a signal to be evaluated.

In step S109, the voltage acquisition unit 110 acquires an input voltage of the power to be inputted from the power system to the power module 50.

In step S111, the calculation unit 120 calculates a predicted amount of change in the power of the power module 50 based on the signal.

In step S113, the calculation unit 120 calculates an amount of change in the input voltage.

In step S115, the calculation unit 120 calculates a degree of relationship between the signal and the input voltage based on the calculated predicted amount of change in the power and the calculated amount of change in the input voltage.

In step S117, the determination unit 130 determines whether or not the degree of relationship has been calculated for all signals to be evaluated among the plurality of signals received by the receiver 15.

If it is determined that the degree of relationship has not been calculated for all the signals (NO in step S117), the processing proceeds to step S105.

If it is determined that the degree of relationship has been calculated for all the signals (YES in step S117), the processing proceeds to step S119, and the determination unit 130 selects a signal to be used in controlling the power module 50, based on the degree of relationship, from among a plurality of signals broadcast for each power system.

In step S121, the power determination unit 140 controls the power module 50 based on the signal selected by the determination unit 130. Note that in the case where only one signal has been received by the receiver 15, the power determination unit 140 controls the power module 50 based on that received signal. Thereafter, the processing shown in the flowchart of FIG. 3 is ended.

Figure 4:
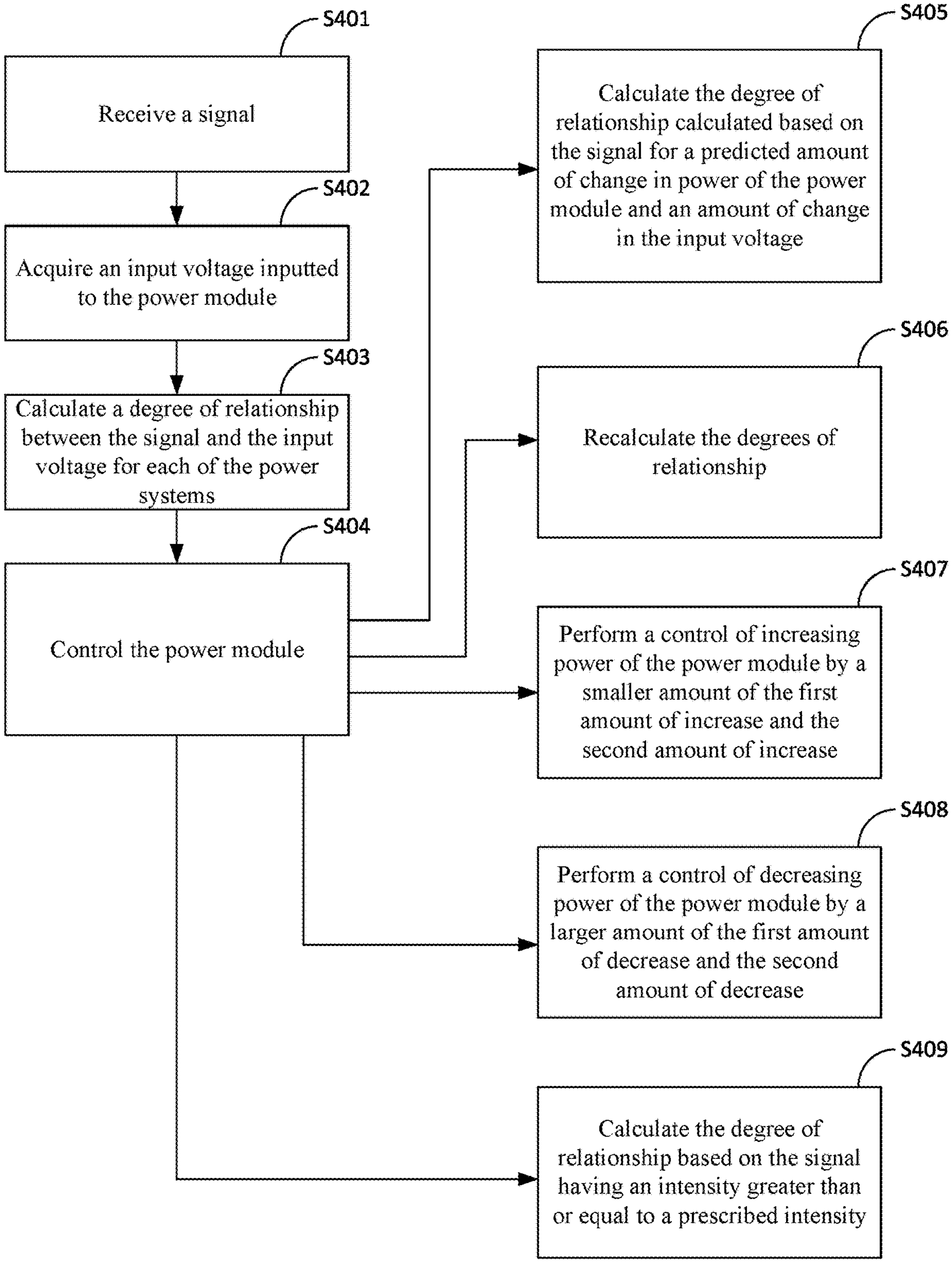
FIG. 4 is a flowchart showing processing of a charging/discharging control in the power system according to the one embodiment of the present invention.

As shown in FIG. 4, a charging/discharging control method of controlling a power module connected to any of a plurality of power systems includes steps S401-S409. The method shown in FIG. 4 may be repeatedly executed while charging is conducted by connecting the power module 50 to the power system. In addition, the method shown in FIG. 4 may be repeatedly executed during a prescribed time period after the power module 50 is connected to the power system. At step S401, a signal broadcast for each of the power systems via a receiver included in the power module is received. At step S402, an input voltage inputted to the power module is acquired. At step S403, a degree of relationship between the signal and the input voltage for each of the power systems is calculated. At step S404, the power module is controlled based on the signal relating to the power system having the degree of relationship greater than or equal to a prescribed threshold. At step S405 the degree of relationship calculated based on the signal for a predicted amount of change in power of the power module and an amount of change in the input voltage having opposite signs is calculated to become larger than the degree of relationship calculated based on the signal for the amount of change and the amount of change in the input voltage having a same sign. At step S406, upon a degree of relationship calculated based on the first signal and a degree of relationship calculated based on the second signal being equal, the degrees of relationship are recalculated based on the first signal and the second signal acquired after power of the power module is changed. At step S407, a control of increasing power of the power module by a smaller amount of a first amount of increase and a second amount of increase is performed. An absolute value of a predicted amount of increase in power of the power module based on the first signal is the first amount of increase, and an absolute value of a predicted amount of increase in power of the power module based on the second signal is the second amount of increase. At step S408, a control of decreasing power of the power module by a larger amount of a first amount of decrease and a second amount of decrease is performed. An absolute value of a predicted amount of decrease in power of the power module based on the first signal is the first amount of decrease. An absolute value of a predicted amount of decrease in power of the power module based on the second signal is the second amount of decrease. At step S409, the degree of relationship is calculated based on the signal having an intensity greater than or equal to a prescribed intensity.

Advantageous Effects of Embodiments

As described above in detail, when controlling a power module connected to any of a plurality of power systems, the charging/discharging control method and the charging/discharging control device according to the present embodiment receive a signal broadcast for each of the power systems via a receiver included in the power module and acquire an input voltage inputted to the power module. The charging/discharging control method and the charging/discharging control device then calculate a degree of relationship between the signal and the input voltage for each power system and control the power module based on the signal relating to the power system having the degree of relationship greater than or equal to a prescribed threshold.

This makes it possible to specify a signal that has to be followed in a charging/discharging control of a power module without designation from a user and start the charging/discharging control of the power module even in a case where a receiver included in the power module receives signals from a plurality of power systems.

Moreover, it is unnecessary to provide a facility that communicates with a controller for controlling a power module in a charging spot which is supplied with power of a power system. As a result, it is possible to suppress an increase in cost.

In addition, the charging/discharging control method and the charging/discharging control device according to the present embodiment may be such that the signal is received at at least two or more time points for each power system. This makes it possible to surely calculate the degree of relationship between the signal and the input voltage. In addition, since with a larger number of time points at which signals are received, the precision of the degree of relationship to be calculated is improved, and it is thus possible to specify a signal that has to be followed in a charging/discharging control of a power module with high precision.

Moreover, the charging/discharging control method and the charging/discharging control device according to the present embodiment may be such that the signal is received for a prescribed time period or more for each power system. This makes it possible to surely calculate the degree of relationship between the signal and the input voltage. In addition, as the signal is received for a prescribed time period or more, the number of time points at which the signals are received increases, and the precision of the degree of relationship to be calculated is improved. Thus, it is possible to specify a signal that has to be followed in a charging/discharging control of a power module with high precision.

In addition, the charging/discharging control method and the charging/discharging control device according to the present embodiment may be such that the degree of relationship calculated based on the signal in a case where a predicted amount of change in the power of the power module and an amount of change in the input voltage have opposite signs is calculated to become larger than the degree of relationship calculated based on the signal in a case where the predicted amount of change in the power of the power module and the amount of change in the input voltage have the same sign.

There is a relation that as the charged power in the entire power module connected to a power system increases, the input voltage of the power module decreases, while as the charged power in the entire power module connected to the power system decreases, the input voltage of the power module increases. The above-described configuration makes it possible to reflect the relation between the charged power in the entire power module and the input voltage in the calculation of the degree of relationship. Therefore, it is possible to improve the precision of the degree of relationship.

Moreover, the charging/discharging control method and the charging/discharging control device according to the present embodiment may be such that when the signal relating to a first power system is called a first signal, and the signal relating to a second power system different from the first power system is called a second signal, in a case where a degree of relationship calculated based on the first signal and a degree of relationship calculated based on the second signal are equal, the degree of relationship is recalculated based on the first signal and the second signal acquired after the power of the power module is changed.

A variation can occur in a signal for adjusting supply power in a power system to which a power module the power of which has been changed is connected. Hence, it is expected that for a signal in which a variation has occurred among a plurality of signals acquired after power of a power module is changed, the degree of relationship after the recalculation becomes large. It becomes easy to specify a signal that has to be used in controlling a power module by recalculating the degree of relationship. By changing the power of the power module by a prescribed amount, it is possible to measure a response of the power system to the change in the power of the power module, and it is thus possible to specify a signal that has to be followed in a charging/discharging control of a power module with high precision.

In addition, the charging/discharging control method and the charging/discharging control device according to the present embodiment may be such that when the signal relating to a first power system is called a first signal, the signal relating to a second power system different from the first power system is called a second signal, an absolute value of a predicted amount of increase in the power of the power module based on the first signal is called a first amount of increase, and an absolute value of a predicted amount of increase in the power of the power module based on the second signal is called a second amount of increase, a control of increasing the power of the power module by a smaller amount of the first amount of increase and the second amount of increase is conducted. This makes it possible to stabilize an operation of the entire power system. In addition, it is possible to reduce an influence on charging/discharging of another power module connected to the power system.

Moreover, the charging/discharging control method and the charging/discharging control device according to the present embodiment may be such that when the signal relating to a first power system is called a first signal, the signal relating to a second power system different from the first power system is called a second signal, an absolute value of a predicted amount of decrease in the power of the power module based on the first signal is called a first amount of decrease, and an absolute value of a predicted amount of decrease in the power of the power module based on the second signal is called a second amount of decrease, a control of decreasing the power of the power module by a larger amount of the first amount of decrease and the second amount of decrease. This makes it possible to stabilize an operation of the entire power system. In addition, it is possible to reduce an influence on charging and discharging of another power module connected to the power system.

In addition, the charging/discharging control method and the charging/discharging control device according to the present embodiment may be such that the degree of relationship is calculated based on the signal having an intensity greater than or equal to a prescribed intensity. This makes it possible to calculate the degree of relationship by narrowing down a plurality of received signals to a signal to be evaluated. As a result, it is possible to reduce a calculation load. Furthermore, time taken to specify a signal that has to be followed in a charging/discharging control of a power module is shortened, and it is thus possible to shorten time until the start of the charging/discharging control.

Moreover, the charging/discharging control method and the charging/discharging control device according to the present embodiment may be such that the signal is transmitted through wireless communications. This makes it possible to broadcast (simultaneously transmit) a control on power modules connected to the power system. It is unnecessary to provide a facility that communicates with a controller for controlling a power module in a charging spot which is supplied with the power of the power system, and it is thus possible to suppress an increase in cost.

Each function shown in the above-mentioned embodiment may be implemented by one or more processing circuits. The processing circuits include a programmed processor, an electric circuit, and the like, and further also include a device such as an application-specific integrated circuit (ASIC), a circuit component arranged to execute a described function, and the like.

Although the content of the present invention has been described along with the embodiment, it is obvious to a person skilled in the art that the present invention is not limited to these descriptions, and various changes and modifications are possible. The discussions and drawings constituting part of this disclosure shall not be construed as limiting the present invention. Various alternative embodiments, examples, and operational techniques will be revealed to a person skilled in the art from this disclosure.

It goes without saying that the present invention encompasses various embodiments and the like that are not described herein. Therefore, the technical scope of the present invention shall be determined only by the invention-specifying matters according to Claims that are reasonable from the above descriptions.

REFERENCE SIGNS LIST

10 charging/discharging control device
15 receiver
21, 31 power supply device
23, 33 transmitter
50 power module
100 controller
110 voltage acquisition unit
120 calculation unit
130 determination unit
140 power determination unit

The invention claimed is:

1. A charging/discharging control method of controlling a power module connected to any of a plurality of power systems, the charging/discharging control method comprising:

receiving a signal broadcast from each of the power systems via a receiver included in the power module;

acquiring an input voltage inputted to the power module;

determining a degree of relationship between the signal and the input voltage for each of the power systems; and controlling the power module based on the signal relating to the power system having the degree of relationship greater than or equal to a prescribed threshold, wherein:

the input voltage inputted to the power module is acquired upon receiving signals broadcast from the power systems, the degree of relationship between the signal and the input voltage is determined for each of the signals broadcast from the power systems, the signal relating to the power system having the degree of relationship greater than or equal to the prescribed threshold is selected and the power module is controlled based on the selected signal, the power module is controlled by a charging/discharging control device mounted on a vehicle on which the power module is mounted, receiving the signal, acquiring the input voltage, determining the degree of relationship, and controlling the power module based on the signal are performed by the charging/discharging control device, the receiver included in the power module is a receiver of the charging/discharging control device, the plurality of power systems includes a first power system having a first broadcast area and a second power system having a second broadcast area at least partially overlapping the first broadcast area, an overlapping broadcast area including the overlapping portions of the first broadcast area and the second broadcast area, the signal relating to the first power system is a first signal and the signal relating to the second power system is a second signal, and the charging/discharging control method further comprises receiving by the charging/discharging control device, via the receiver:

(i) the first signal broadcast from the first power system when the vehicle is positioned within the first broadcast area, (ii) the second signal broadcast from the second power system when the vehicle is positioned within the second broadcast area, and (iii) the first signal broadcast from the first power system and the second signal broadcast from the second power system when the vehicle is positioned within the overlapping broadcast area.

2. The charging/discharging control method according to claim 1, comprising: receiving the signal at at least two or more time points for each of the power systems.

3. The charging/discharging control method according to claim 1, comprising:

receiving the signal for a prescribed time period or more for each of the power systems.

4. The charging/discharging control method according to claim 1, comprising: determining the degree of relationship determined based on the signal for a predicted amount of change in power of the power module and an amount of change in the input voltage having a negative correlation to become larger than the degree of relationship determined based on the signal for the predicted amount of change in power and the amount of change in the input voltage having a positive correlation.

5. The charging/discharging control method according to claim 1, wherein the charging/discharging control method comprises, upon a degree of relationship determined based on the first signal and a degree of relationship determined based on the second signal being equal, redetermining the degrees of relationship based on the first signal and the second signal acquired after power of the power module is changed.

6. The charging/discharging control method according to claim 1, wherein the first signal is indicative of a first supply power adjustment in the first power system, the second signal is indicative of a second supply power adjustment in the second power system, an absolute value of a first predicted amount of increase in power of the power module based on the first signal is a first amount of increase corresponding with the first supply power adjustment when the power module is controlled based on the first signal, an absolute value of a second predicted amount of increase in power of the power module based on the second signal is a second amount of increase corresponding with the second supply power adjustment when the power module is controlled based on the second signal, and the charging/discharging control method comprises performing a control of increasing power of the power module by a smaller amount of the first amount of increase and the second amount of increase.

7. The charging/discharging control method according to claim 1, wherein the first signal is indicative of a first supply power adjustment in the first power system, the second signal is indicative of a second supply power adjustment in the second power system, an absolute value of a first predicted amount of decrease in power of the power module based on the first signal is a first amount of decrease corresponding with the first supply power adjustment when the power module is controlled based on the first signal, an absolute value of a second predicted amount of decrease in power of the power module based on the second signal is a second amount of decrease corresponding with the second supply power adjustment when the power module is controlled based on the second signal, and the charging/discharging control method comprises performing a control of decreasing power of the power module by a larger amount of the first amount of decrease and the second amount of decrease.

8. The charging/discharging control method according to claim 1, comprising: determining the degree of relationship based on the signal having an intensity greater than or equal to a prescribed intensity.

9. The charging/discharging control method according to claim 1, wherein the signal is transmitted through wireless communications.

10. The charging/discharging control method according to claim 1, wherein the charging/discharging control method further comprises selecting the first signal or the second signal having a higher degree of relationship and controlling the power module based on the selected first signal or second signal, the degree of relationship determined based on the first signal and the degree of relationship determined based on the second signal each being greater than or equal to the prescribed threshold.

11. The charging/discharging control method according to claim 1, wherein the first power system includes a first charging spot, a second charging spot, and a first transmitter configured to transmit the first signal to be received by the receiver of the power module, and wherein the second power system includes a third charging spot, a fourth charging spot, and a second transmitter configured to transmit the second signal to be received by the receiver of the power module.

12. The charging/discharging control method according to claim 11, wherein when the power module is positioned at the second charging spot of the first power system or at the third charging spot of the second power system, the power module is positioned within the overlapping broadcast area.

13. A charging/discharging control method of controlling a power module connected to any of a plurality of power systems, the charging/discharging control method comprising:

receiving a signal broadcast from each of the power systems via a receiver included in the power module;

acquiring an input voltage inputted to the power module;

determining a degree of relationship between the signal and the input voltage for each of the power systems; and controlling the power module based on the signal relating to the power system having the degree of relationship greater than or equal to a prescribed threshold, wherein:

the power module is controlled by a charging/discharging control device mounted on a vehicle on which the power module is mounted, receiving the signal, acquiring the input voltage, determining the degree of relationship, and controlling the power module based on the signal are performed by the charging/discharging control device, the receiver included in the power module is a receiver of the charging/discharging control device, the plurality of power systems includes a first power system having a first broadcast area and a second power system having a second broadcast area at least partially overlapping the first broadcast area at an overlapping broadcast area, the signal relating to the first power system is a first signal for adjusting supply power in the first power system and the signal relating to the second power system is a second signal for adjusting supply power in the second power system, and the charging/discharging control method further comprises, by the charging/discharging control device:

(i) receiving, upon the power module being positioned within the first broadcast area other than the overlapping broadcast area, the first signal broadcast from the first power system via the receiver and controlling the power module based on the first signal;

(ii) receiving, upon the power module being positioned within the second broadcast area other than the overlapping broadcast area, the second signal broadcast from the second power system via the receiver and controlling the power module based on the second signal; and (iii) upon the power module being positioned within the overlapping broadcast area:

receiving, via the receiver, the first signal broadcast from the first power system and the second signal broadcast from the second power system;

acquiring, upon receiving both the first signal and the second signal, the input voltage inputted to the power module;

determining a first degree of relationship between the first signal and the acquired input voltage;

determining a second degree of relationship between the second signal and the acquired input voltage;

selecting a signal of the first signal and the second signal having the degree of relationship greater than or equal to the prescribed threshold; and controlling the power module based on the selected signal.

14. The charging/discharging control method according to claim 13, further comprising, by the charging/discharging control device:

determining a first predicted amount of change in power of the power module based on the first signal;

determining a second predicted amount of change in power of the power module based on the second signal;

determining an amount of change in the input voltage;

determining the first degree of relationship between the determined first predicted amount of change in power and the determined amount of change in the input voltage; and determining the second degree of relationship between the determined second predicted amount of change in power and the determined amount of change in the input voltage.

* * * * *